(12) United States Patent
Huang et al.

(10) Patent No.: US 10,026,801 B2
(45) Date of Patent: Jul. 17, 2018

(54) INDUCTOR DEVICE

(71) Applicant: SEMICONDUCTOR MANUFACTURING INTERNATIONAL (SHANGHAI) CORPORATION, Shanghai (CN)

(72) Inventors: Herb He Huang, Shanghai (CN); Hongtao Ge, Shanghai (CN); Haiting Li, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/340,683

(22) Filed: Nov. 1, 2016

(65) Prior Publication Data

US 2017/0069707 A1    Mar. 9, 2017

Related U.S. Application Data

(62) Division of application No. 14/539,896, filed on Nov. 12, 2014, now Pat. No. 9,515,133.

(30) Foreign Application Priority Data

Jan. 26, 2014    (CN) .......................... 2014 1 0038081

(51) Int. Cl.
  *H01L 29/00*    (2006.01)
  *H01L 49/02*    (2006.01)
  *H01L 27/06*    (2006.01)
  *H01L 21/768*    (2006.01)
  *H01L 23/535*    (2006.01)
  (Continued)

(52) U.S. Cl.
  CPC ............ *H01L 28/10* (2013.01); *H01L 21/768* (2013.01); *H01L 23/5227* (2013.01); *H01L 23/535* (2013.01); *H01L 27/0617* (2013.01); *H01L 29/0649* (2013.01); *H01L 21/02164* (2013.01); *H01L 21/31055* (2013.01); *H01L 21/31111* (2013.01); *H01L 21/31116* (2013.01); *H01L 21/7684* (2013.01); *H01L 23/522* (2013.01); *H01L 2924/0002* (2013.01)

(58) Field of Classification Search
  CPC . H01L 28/10; H01L 27/0617; H01L 23/5227; H01L 27/08; H01L 2924/3011; H01L 21/02271; H01L 21/76843; H01L 21/31055; H01L 21/31111; H01F 17/0006; G01L 21/31116
  USPC ................ 257/531, 379, 516, 528, E27.009, 257/E27.113; 438/171, 190, 210
  See application file for complete search history.

(56) References Cited

U.S. PATENT DOCUMENTS

2006/0263727 A1* 11/2006 Lee ..................... H01L 23/3114
                                                                    430/311
2010/0246152 A1*  9/2010 Lin ....................... H01L 21/563
                                                                    361/783

(Continued)

*Primary Examiner* — Thinh T Nguyen
(74) *Attorney, Agent, or Firm* — Anova Law Group, PLLC

(57) ABSTRACT

A semiconductor device includes an inductor disposed on a surface of an intermetallic dielectric layer at a location below which no virtual interconnect members are present. Thus, parasitic capacitance is reduced or eliminated and the Q value of the inductor is high.

7 Claims, 8 Drawing Sheets

(51) Int. Cl.
  *H01L 29/06* (2006.01)
  *H01L 21/3105* (2006.01)
  *H01L 21/311* (2006.01)
  *H01L 21/02* (2006.01)
  *H01L 23/522* (2006.01)

(56) References Cited

U.S. PATENT DOCUMENTS

2012/0062040 A1* 3/2012 Kaeriyama ......... H01L 23/5227
  307/104
2014/0175602 A1* 6/2014 Funaya ............. H01L 23/49575
  257/531

* cited by examiner

INDUCTOR DEVICE

CROSS-REFERENCES TO RELATED APPLICATIONS

This application is a divisional application of U.S. patent application Ser. No. 14/539,896, entitled "INDUCTOR DEVICE AND FABRICATION METHOD", filed on Nov. 12, 2014, which claims priority to Chinese patent application No. 201410038081.4, filed on Jan. 26, 2014, the contents of which are incorporated herein by reference in their entirety.

BACKGROUND OF THE INVENTION

The present invention relates to manufacturing of semiconductor devices, and more particularly to a semiconductor device having an inductor, an electronic apparatus including the semiconductor device and a method of manufacturing the same.

A radio frequency front-end module (RF FEM) is a key component in a wireless communication device, such as mobile phones, tablet PCs, and the like. RF switches and integrated circuits are key components used in RF front-end modules.

A RF front-end module includes capacitors and inductors. The Q value of an inductor determines the quality level of the RF FEM. Due to the loading effect associated with conventional chemical mechanical polishing process of copper, certain restrictions are imposed in in the pattern density of the metal lines, i.e., a virtual (dummy) pattern is designed in a relatively large blank area to meet the minimum pattern density.

A conventional semiconductor device (e.g., a RF FEM) may have a structure as shown in FIG. 1. The semiconductor device includes a front-end device 100, an interlayer dielectric layer 101 on the front-end, a connecting member 102 and a virtual connection (virtual pattern) 102' formed of a metal material, an intermetallic dielectric layer 103 on the interlayer dielectric layer, an inductor 104 on the intermetallic dielectric layer. Front-end device 100 includes a semiconductor substrate 1001, a transistor 1002 disposed on the semiconductor substrate, an interlayer dielectric layer 1003 on the semiconductor substrate, and a metal plug 1004 disposed within the interlayer dielectric layer 1003. Additionally, the semiconductor may also include resistors and other devices.

Because inductor 104 takes up a large area and the connecting member 102 is a metal (generally copper), it is necessary to set a dummy pattern 102' in a blank area of the interlayer dielectric layer to alleviate the loading effect caused by a chemical mechanical polishing process during the formation of connecting member 102, as shown in FIG. 1. However, because the virtual connection (dummy) pattern 102' is located below inductor 104, a significant amount of parasitic is generated between the inductor and the virtual connection pattern, which affects the Q value of inductor 104 and ultimately reduces the performance of the semiconductor.

Therefore, it would be desirable to provide an improved way of manufacturing a semiconductor device, which avoids the drawbacks mentioned above.

BRIEF SUMMARY OF THE INVENTION

Embodiments of the present invention disclose a semiconductor device, an electronic apparatus including the semiconductor device, and a method of manufacturing the semiconductor device.

In one embodiment, a method of manufacturing a semiconductor device includes:

S101: providing a semiconductor substrate including a front-end device. The front-end device includes a transistor formed in and on the semiconductor substrate, a first interlayer dielectric layer on the semiconductor substrate and a metal plug disposed within the first interlayer dielectric layer;

S102: forming a second interlayer dielectric layer on the first interlayer dielectric layer, and forming a metal layer in the second interlayer dielectric layer. The metal layer includes an interconnect member and a virtual interconnect member;

S103: removing the virtual interconnect member to form a trench, and filling the trench with a dielectric filling layer;

S104: forming an intermetallic layer on the second interlayer dielectric layer, and forming an inductor on the intermetallic layer above the location of the dielectric filling layer.

In an embodiment, S103 may include:

S1031: forming a barrier layer on the second interlayer dielectric layer, forming a mask layer on the barrier layer, and patterning the mask layer to form an opening at the location of the dielectric filling layer;

S1032: removing a portion of the barrier layer not covered by the mask layer (i.e., the portion of the barrier layer exposed by the opening is removed) to expose the dielectric filling layer, and removing the exposed dielectric filling layer to form the trench;

S1033: removing the mask layer, and filling the trench with a dielectric filling material;

S1034: planarizing the dielectric filling material by performing a chemical mechanical polishing process.

In an embodiment, the mask layer is a photoresist.

In an embodiment, the portion of the barrier layer is removed using a dry etching process and the dielectric filling layer is removed using a wet etching process.

In an embodiment, filling the trench with the dielectric filling material includes a chemical vapor deposition process.

In an embodiment, the chemical mechanical polishing process stops when a surface of the barrier layer is exposed.

In an embodiment, the dielectric filling layer and the second interlayer dielectric layer are formed of the same material. The material of the dielectric filling layer is silicon oxide.

In an embodiment, forming the metal layer in the second interlayer dielectric layer includes forming multiple trenches in the second interlayer dielectric layer, forming a metal layer in the trenches, and performing a chemical mechanical polishing process on the metal layer.

In an embodiment, the inductor includes a projection in a direction vertical to the intermetallic dielectric layer, and the vertical projection covers or overlaps the dielectric filling layer.

In another embodiment, a semiconductor device includes a front-end device, an interlayer dielectric layer on the front-end device, an interconnect member within the interlayer dielectric layer and connected with the front-end device, a dielectric filling layer within the interlayer dielectric layer, an intermetallic dielectric layer on the interlayer dielectric layer, and an inductor on the intermetallic dielectric layer and disposed above the dielectric filling layer. The inductor has a vertical projection to the intermetallic dielectric layer that covers the dielectric filling layer.

In an embodiment, the dielectric filling layer and the second interlayer dielectric layer are formed of the same material.

In an embodiment, the front-end device includes a semiconductor substrate, a transistor disposed on and in the semiconductor substrate, a dielectric layer disposed on the semiconductor substrate, an interconnect member disposed within the dielectric layer, and a metal plug disposed within the dielectric layer and connected with the interconnect member.

The following description, together with the accompanying drawings, will provide a better understanding of the nature and advantages of the claimed invention.

DETAILED DESCRIPTION OF THE INVENTION

Figure 1:
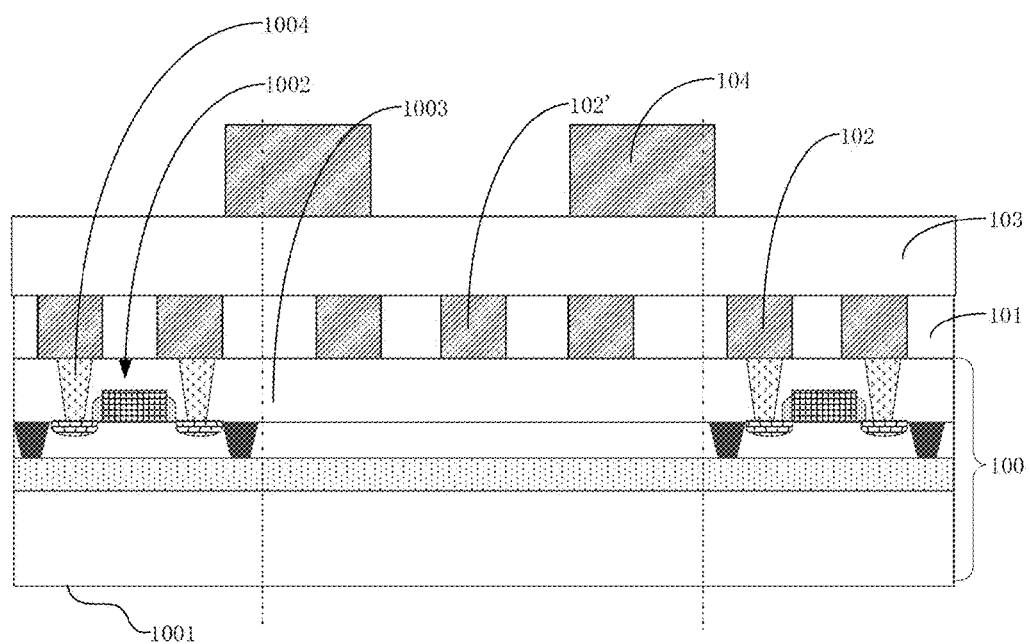
FIG. 1 is a cross-sectional view of a conventional semiconductor device.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. As used in this specification and the appended claims, the singular forms "a", "an", and "the" encompass embodiments having plural referents, unless the content clearly dictates otherwise.

It be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terms "horizontal" as used in this application are defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Example 1

FIGS. 2A through 2G are cross-sectional views of intermediate stages of a semiconductor device according to a manufacturing method of the present invention.

Figure 2A:
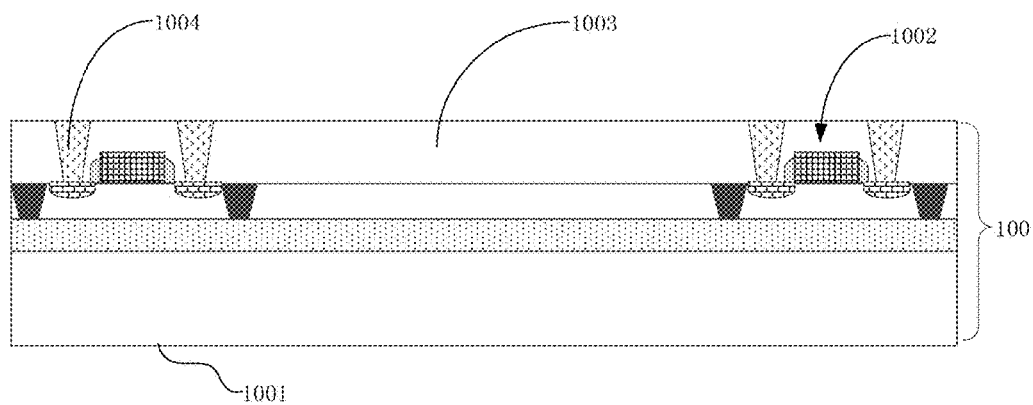
FIGS. 2A through 2G are cross-sectional views of intermediate stages of a semiconductor device according to a manufacturing method of the present invention.

In an embodiment, a method may include the following steps:

A1: provide a semiconductor substrate 1001 having a front-end device 100. Front-end device 100 includes a transistor 1002, an interlayer dielectric layer 1003 on the substrate and a metal plug 1004 in the interlayer dielectric layer, as shown in FIG. 2A.

Front-end device 100 may also include one or more resistors and other electric components. Transistor 1002 may be a MOS transistor, a bipolar transistor, or other types of transistors.

In an embodiment, front-end device 100 may be formed from a standard CMOS process. Semiconductor substrate 1001 may be a silicon-on-insulator (SOI) semiconductor substrate, metal plug 1004 connecting transistor 1002 or other devices may be made of a tungsten (W) material.

A2: form an interlayer dielectric layer 101 on interlayer dielectric layer 1003 and form an interconnect member 102 and a virtual interconnect member 102' below a location of an inductor from a metal layer (referred to as a first metal layer M1) in interlayer dielectric layer 101. Interconnect member 102 member is connected with a source/drain region of transistor 1002, as shown in FIG. 2B.

In the embodiment, interlayer dielectric layer 1003 is referred to as the first interlayer dielectric layer and interlayer dielectric layer 101 is referred to as the second interlayer dielectric layer, which is disposed on the first interlayer dielectric layer.

Interconnect member 102 and virtual interconnect member 102' are made of copper or any suitable materials. In an embodiment, interconnect member 102 is a single damascene structure, as shown in FIG. 2B.

Figure 2B:
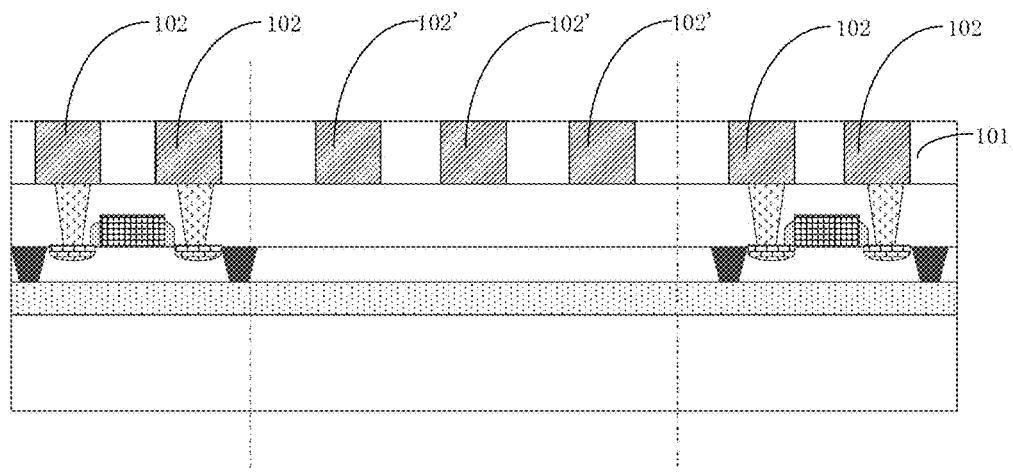

Interconnect member 102 and virtual interconnect member 102' can be formed with the following steps: forming trenches in interlayer dielectric layer 101; forming a first metal layer M1 filling the trenches, planarizing interconnect member 102 and virtual interconnect member 102' by performing a chemical mechanical polishing (CMP) process so that the interconnect member and the virtual interconnect member are coplanar with the upper surface of the second interlayer dielectric layer, as shown in FIG. 2B.

In an embodiment, the purpose of virtual interconnect member 102' is used to reduce the loading effect during the formation of interconnect member 102 using a CMP process. Because the inductor generally has a relatively large area, if virtual interconnect member 102' is formed below the inductor, then there will be significant loading effect in the area below the inductor when performing the CMP process and may affect the production yield.

However, since virtual interconnect member 102' is formed below the inductor, and virtual interconnect member 102' is conductive, therefore, a significant amount of parasitic capacitance is generated between the inductor and the virtual interconnect member, the inductance to be formed may have a low Q value degrading the device performance.

Figure 2C:
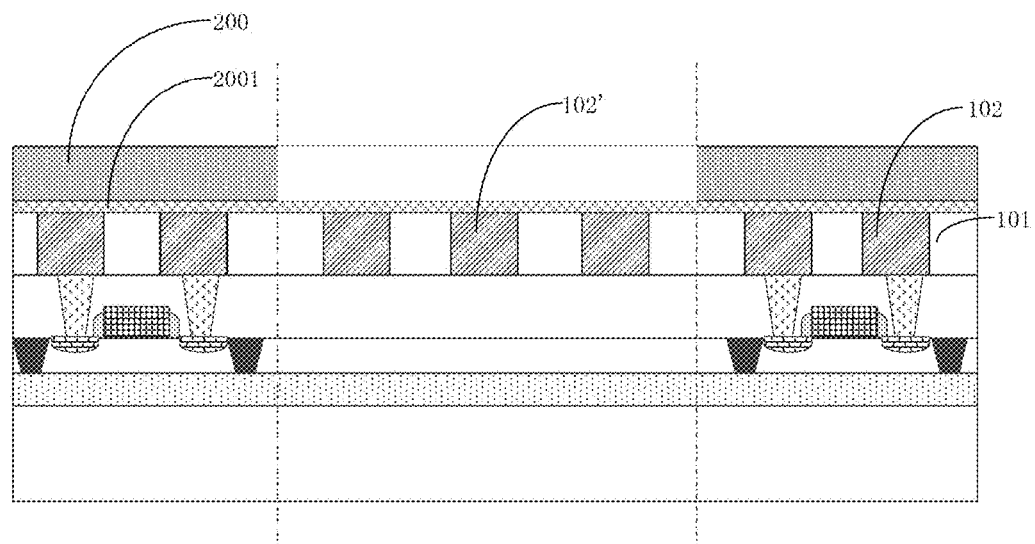
Figure 2D:
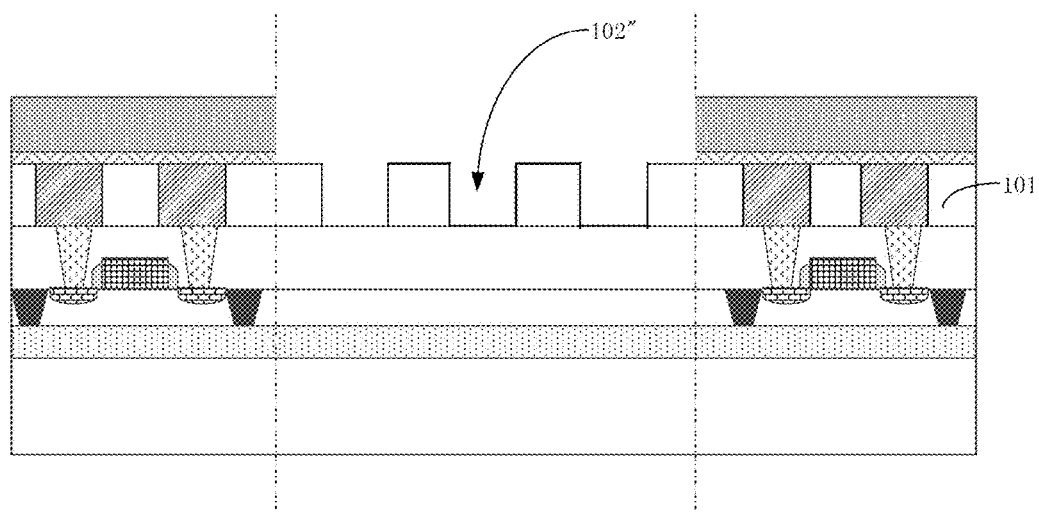

A3: remove virtual interconnect member 102' to form a trench 102", as shown in FIG. 2D. Fill trench 102" with a dielectric filling layer 103, as shown in FIG. 2F. In an embodiment, A3 may include:

A31: form a barrier layer 2001 over interlayer dielectric layer 101, interconnect member 102 and virtual interconnect member 102', and form a mask layer 200 over barrier layer 2001. Mask layer 200 has an opening at the location of virtual interconnect member 102', as shown in FIG. 2C. The opening in the mask layer can be formed using a photolithographic patterning process.

A32: remove a portion of barrier layer 2001 not covered by the mask (i.e., the portion located at the opening of mask layer 200) using a first etching process to expose virtual interconnect member 102', and remove exposed virtual interconnect member 102' using a second etching process. The first etching process may be a dry etching and a second etching process may be a wet etching.

Figure 2E:
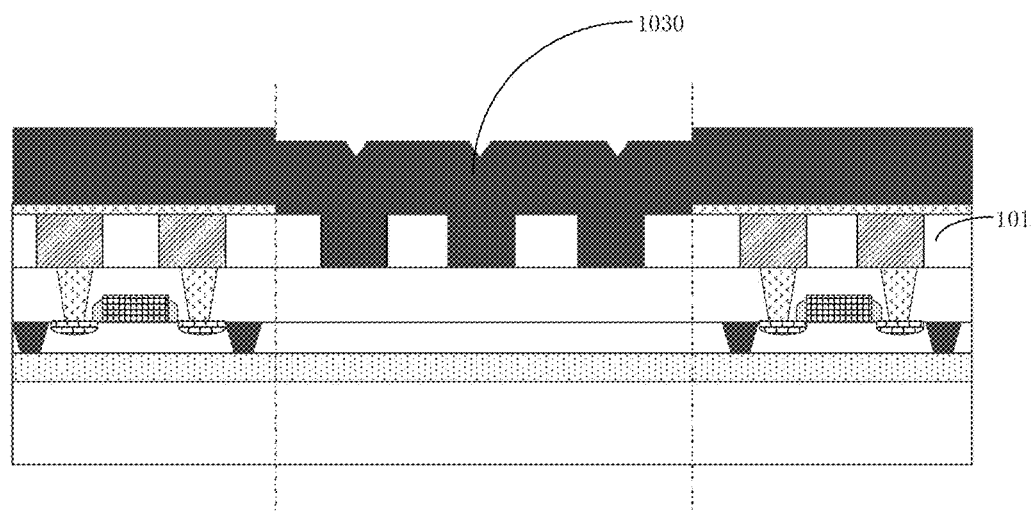
Figure 2F:
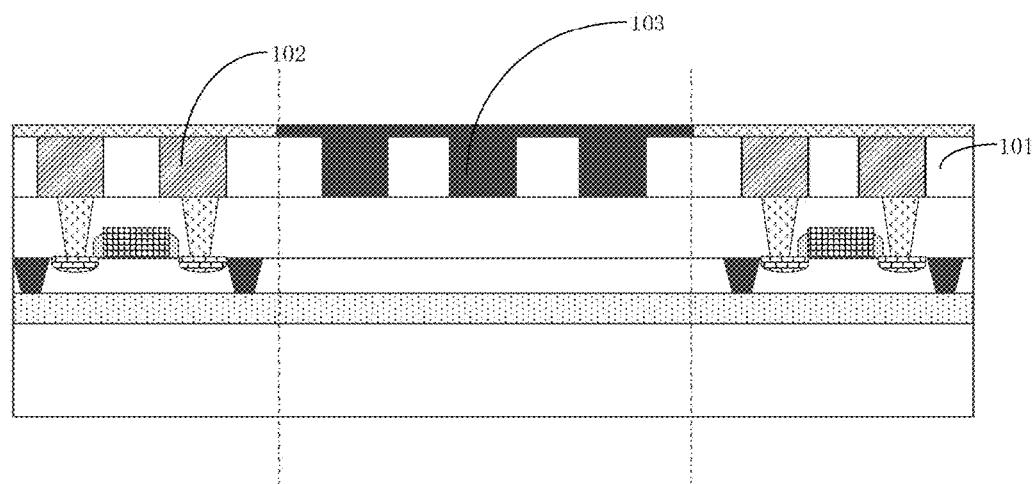

A33: remove mask layer 200 and fill the trench at the location of the removed virtual interconnect member with a dielectric fill material 1030 (alternatively referred to as dielectric filling layer), as shown in FIG. 2E. Filling the trench may utilize a chemical vapor deposition (CVD) process or any suitable deposition processes. Dielectric fill material 1030 can be the same material as interlayer dielectric layer 101 or it can be a material different from the material of interlayer dielectric layer 101.

A34: remove the excess dielectric fill material (excess of dielectric filling layer) 1030 using a chemical mechanical polishing (CMP) process. The CMP process stops when the upper surface of barrier 2001 is exposed so that dielectric filling layer 103 is coplanar with the upper surface of barrier 2001. The CMP process stops at barrier layer 2001 so that interlayer dielectric layer 101 is not damaged by the CMP process.

Figure 2G:
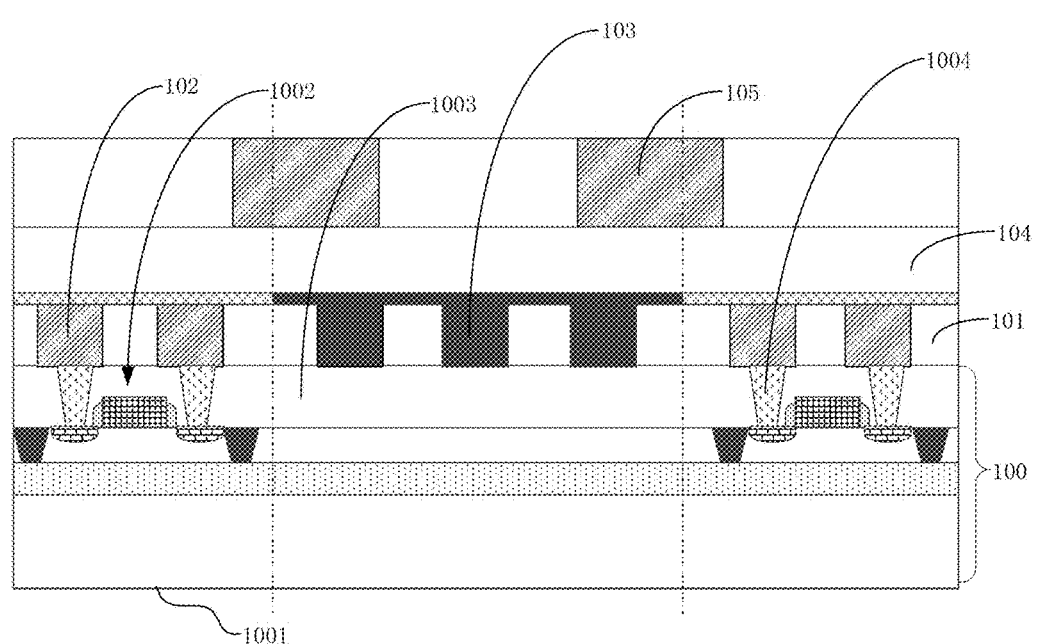

A4: form an intermetallic dielectric layer 104 on dielectric filler layer 103 and form an inductor 105 on intermetallic dielectric layer 104 at the location of dielectric filling layer 103, as shown in FIG. 2G.

As shown, the blank area of interconnect dielectric layer 101 below inductor 105 does not include virtual interconnect member 102'. Due to the fact that virtual interconnect member 102' is absent in the area below inductor 105, parasitic capacitance will be reduced or eliminated, and the Q value of inductor 105 is increased and the performance of the semiconductor device is improved.

It is to be understood by those skilled in the art that inductor 105 is a coil wound on a surface of the intermetallic dielectric layer 104 and arranged in parallel to the surface of the substrate, and FIG. 2G is a cross-sectional view illustrating only two opposite terminals of inductor 105. In an embodiment, inductor 105 has a projection in a direction vertical to the intermetallic dielectric layer, and the vertical projection covers dielectric filler layer 103 (delineated by two dashed vertical lines).

Figure 2H:
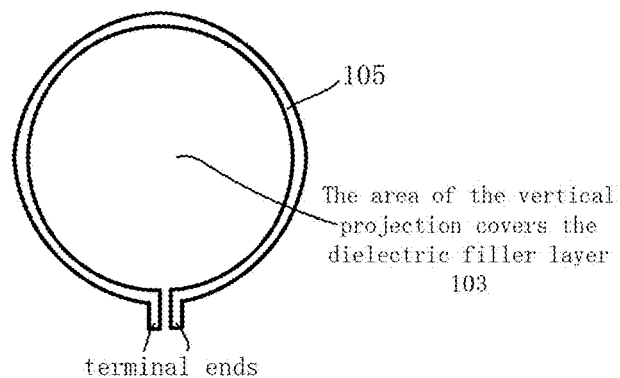
FIG. 2H is a plan view of a circular inductor coil having a circular contour between two terminal ends according to an exemplary embodiment of the present invention.
Figure 2I:
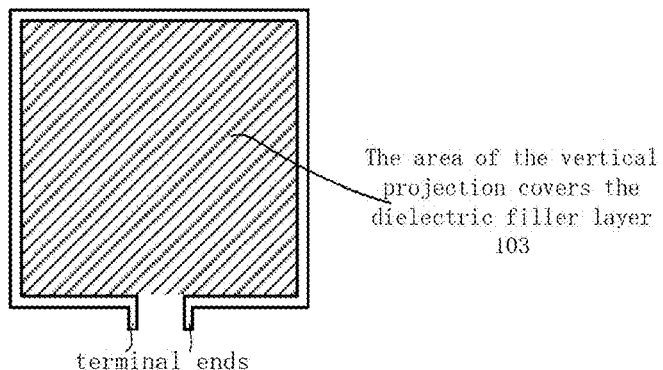
FIG. 2I is a plan view of an inductor coil having a square shape or a rectangular shape according to an exemplary embodiment of the present invention.
Figure 2J:
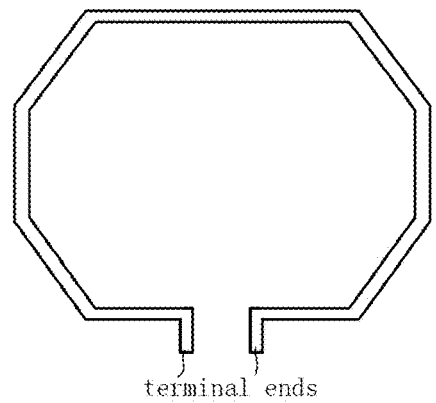
FIG. 2J is a plan view of an inductor coil having a polygonal shape according to an exemplary embodiment of the present invention.

FIGS. 2H through 2J are plan views of inductor structures according to exemplary embodiments of the present invention. The inductor comprises a projection in a direction vertical to the surface of the substrate covering the dielectric filler layer 103.

An embodiment of the present invention discloses a method of manufacturing a semiconductor device comprising removing the virtual interconnect member to form a trench and filling the trench with a dielectric filling layer, so that an inductor thus, formed has an improved Q value, which in turn increases the performance of the semiconductor device.

Figure 3:
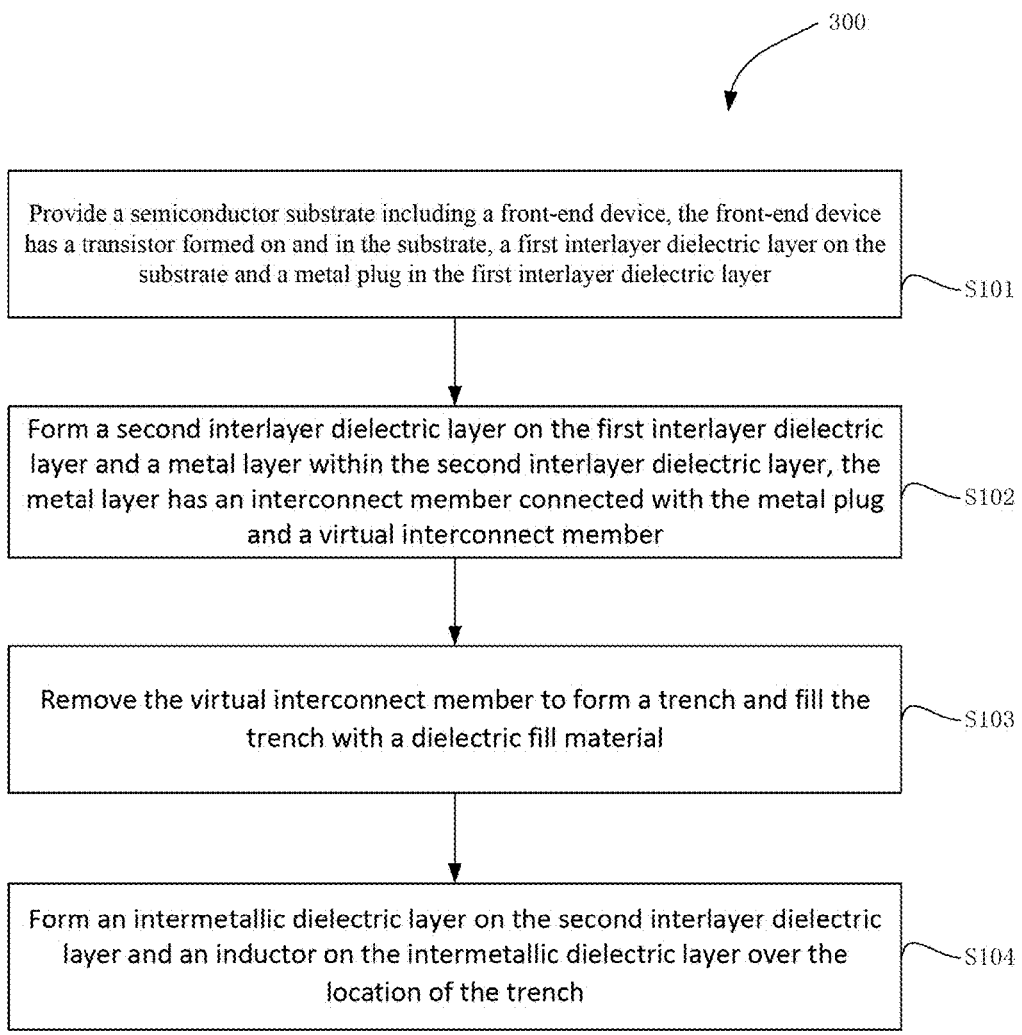
FIG. 3 is a flow chart of a method of manufacturing a semiconductor device according to an embodiment of the present invention.

FIG. 3 is a flow chart of a method 300 of manufacturing a semiconductor device according to an embodiment of the present invention. Method 300 includes:

S101: provide a semiconductor substrate having a front-end device. The front-end device includes a transistor, a first interlayer dielectric layer on the semiconductor substrate, and a metal plug in the first interlayer dielectric layer;

S102: form a second interlayer dielectric layer on the front-end device, and form a metal layer in the second interlayer dielectric layer. The metal layer includes an interconnect member connecting the metal plug and a virtual interconnect member at a location below a to be formed inductor;

S103: remove the virtual interconnect member to form a trench and fill the trench with a dielectric filler layer;

S104: form an intermetallic dielectric layer on the second interlayer dielectric layer and form the inductor on the intermetallic dielectric layer.

Example 2

Figure 4:
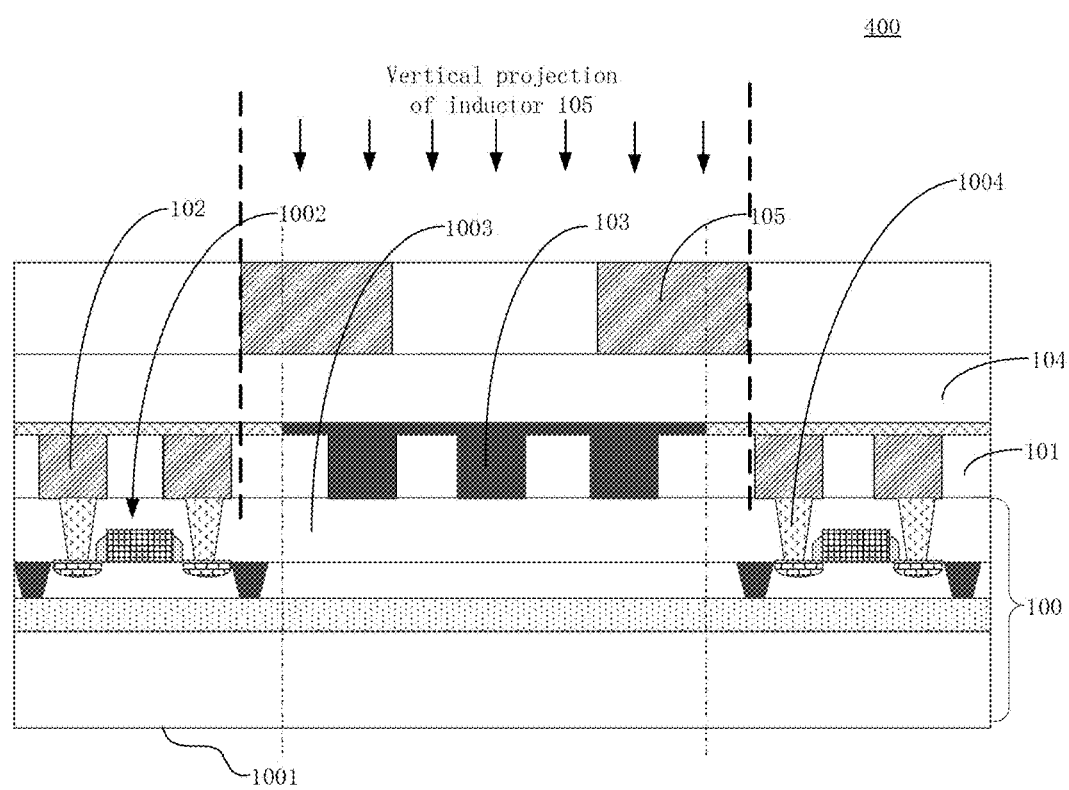
FIG. 4 is a cross-sectional view of a semiconductor device according to an embodiment of the present invention.

FIG. 4 is a cross-sectional view of a semiconductor device 400 according to an embodiment of the present invention. Semiconductor device 400 includes a front-end device 100, an interlayer dielectric layer 101 on front-end device 100, and an interconnect member 102 within interlayer dielectric layer 101. Semiconductor device 400 also includes a dielectric filling layer 103 within interlayer dielectric layer 101, an intermetallic dielectric layer 104 on dielectric filling layer 103 and interlayer dielectric layer 101, and an inductor 105 on intermetallic dielectric layer 104. Inductor 105 is disposed at a location above dielectric filling layer 103.

Semiconductor device 400 of the present invention differs from the conventional device. In more detail, semiconductor device 400 of the present invention does not have virtual interconnect member 102' below inductor 105, whereas virtual interconnect member 102' is present below inductor 105 in the conventional device.

Furthermore, the projection of inductor 105 in a direction vertical to intermetallic dielectric layer 104 covers dielectric filler layer 103, as shown in FIG. 4.

In an embodiment, dielectric filling layer 103 and interlayer dielectric layer 101 are made of the same material. In an embodiment, dielectric filler layer 103 is made of silicon oxide or other suitable material.

In an embodiment, front-end device 100 includes a semiconductor substrate 1001, a transistor 1002 disposed on and in semiconductor substrate 1001, a first interlayer dielectric layer 1003 on semiconductor substrate 1001, and a metal plug 1004 in first interlayer dielectric layer 1003. Metal plug 1004 is connected with interconnect member 102.

Semiconductor device 400 can be formed according to method 300 described above in Example 1, so that the method of manufacturing semiconductor device 400 will not be repeated herein for the sake of brevity.

Because the semiconductor device of the present invention does not have a virtual interconnect member below the location of an inductor, the inductor thus has an improved Q value and the semiconductor device of the present invention has a better performance.

Example 3

Embodiments of the present invention provide an electronic device comprising a semiconductor device manufactured using the method described in example 1 or having a device structure described in example 2. Due to the absence of a virtual interconnect member below the inductor, a parasitic capacitance associated with the virtual interconnect member is eliminated, thus, the Q value of the inductor is increased so that the performance of the electronic device is also improved.

The electronic device can be a mobile phone, a tablet PC, a laptop, a netbook, a game console, TV, VCD, DVD, a GPS, a MP3/MP4 player, a play station, and any other electronic products, or an intermediate product such a printed circuit board having a semiconductor device containing the structure of the present invention or manufactured using the manufacturing method of the present invention.

The present invention has broader applications than the production of a semiconductor device having a high Q value inductor. The process step employed by the invention can be used to manufacture any semiconductor device requiring the absence of a virtual interconnect member on a semiconductor substrate. The invention enables the removal of a virtual interconnect member without causing damage to the front-end device.

While the embodiments are described herein with reference to illustrative embodiments, this description is not intended to be construed in a limiting sense. Various modifications and combinations of the illustrative embodiments will be apparent to those skilled in the art upon references to the description. It is therefore intended that the appended claims encompass any such modifications.

What is claimed is:

1. A semiconductor device comprising:
   a front-end device;
   an interlayer dielectric layer on the front-end device,
   an interconnect member within the interlayer dielectric layer and connected with the front-end device;
   a dielectric material layer within the interlayer dielectric layer;
   an intermetallic dielectric layer on the interlayer dielectric layer;
   a barrier layer interposed between the interlayer dielectric layer and the intermetallic dielectric layer and having an upper surface coplanar with an upper surface of the dielectric material layer; and
   an inductor on the intermetallic dielectric layer.

2. The semiconductor device of claim 1, wherein the inductor has a projection in a direction vertical to the intermetallic dielectric layer covering the dielectric material layer.

3. The semiconductor device of claim 1, wherein the dielectric material layer and the interlayer dielectric layer are formed of a same material.

4. The semiconductor device of claim 1, wherein the front-end device comprises:
   a semiconductor substrate;
   a transistor on and in the semiconductor substrate;
   a dielectric layer on the semiconductor substrate;
   an interconnect member disposed within the dielectric layer; and
   a metal plug within the dielectric layer connected with the interconnect member.

5. An electronic apparatus comprising a semiconductor device, the semiconductor device comprises:
   a front-end device;
   an interlayer dielectric layer on the front-end device,
   an interconnect member within the interlayer dielectric layer and connected with the front-end device;
   a dielectric material layer within the interlayer dielectric layer;
   an intermetallic dielectric layer on the interlayer dielectric layer;
   a barrier layer interposed between the interlayer dielectric layer and the intermetallic dielectric layer and having an upper surface coplanar with an upper surface of the dielectric material layer; and
   an inductor on the intermetallic dielectric layer.

6. The electronic apparatus of claim 5, wherein the inductor has a projection in a direction vertical to the intermetallic dielectric layer covering the dielectric material layer.

7. The electronic apparatus of claim 5, wherein the dielectric material layer and the interlayer dielectric layer are formed of a same material.

* * * * *